(12) United States Patent
Schultz

(10) Patent No.: US 7,818,157 B2
(45) Date of Patent: Oct. 19, 2010

(54) INSTANTANEOUS VOLTAGE DROP SENSITIVITY ANALYSIS TOOL (IVDSAT)

(75) Inventor: Richard T. Schultz, Fort Collins, CO (US)

(73) Assignee: LSI Corporation, Milpitas, CA (US)

( * ) Notice: Subject to any disclaimer, the term of this patent is extended or adjusted under 35 U.S.C. 154(b) by 1793 days.

(21) Appl. No.: 10/174,681

(22) Filed: Jun. 19, 2002

(65) Prior Publication Data

US 2003/0237059 A1 Dec. 25, 2003

(51) Int. Cl.
G06F 17/50 (2006.01)
G06F 9/45 (2006.01)
G06F 9/44 (2006.01)
G06F 9/455 (2006.01)
H03K 19/00 (2006.01)

(52) U.S. Cl. .................. 703/14; 716/4; 716/7; 716/8; 716/9; 716/17

(58) Field of Classification Search .............. 716/4, 716/8–9, 17; 703/14
See application file for complete search history.

(56) References Cited

U.S. PATENT DOCUMENTS

| | | | | |
|---|---|---|---|---|
| 5,404,310 A * | 4/1995 | Mitsuhashi | ............... | 716/13 |
| 5,446,676 A * | 8/1995 | Huang et al. | ............... | 703/19 |
| 5,648,910 A * | 7/1997 | Ito | ............... | 716/2 |
| 5,872,952 A * | 2/1999 | Tuan et al. | ............... | 703/14 |
| 6,311,147 B1 * | 10/2001 | Tuan et al. | ............... | 703/18 |
| 6,523,154 B2 * | 2/2003 | Cohn et al. | ............... | 716/6 |
| 6,675,139 B1 * | 1/2004 | Jetton et al. | ............... | 703/17 |
| 6,895,372 B1 * | 5/2005 | Knebel et al. | ............... | 703/14 |
| 6,900,544 B2 * | 5/2005 | Boireau | ............... | 257/773 |
| 7,016,794 B2 * | 3/2006 | Schultz | ............... | 702/64 |
| 2002/0087940 A1 * | 7/2002 | Greidinger et al. | ............... | 716/2 |

OTHER PUBLICATIONS

Altera, Minimizing Ground Bounce & Vcc Sag, Nov. 2001, ver 1.0.*
Oh et al. "Multi-pad Power/Ground Network Design for Uniform Distribution of Ground Bounce", 1998, ACM, DAC '98, pp. 287-290.*
Neamen, Electronic Circuit Analysis and Design, $2^{nd}$ Edition, 2001, Ch 10, 16 pgs.*
Banerjee et al., "Coupled Analysis of Electromigration Reliability and Performance in ULSI Signal Nets", Proc. of 2001 IEEE/ACM international conference on Computer-aided design, IEEE, 2001, 8 pages.*
Richard T. Schultz, "Floor Plan Development Electromigration and Voltage Drop Analysis Tool", U.S. Appl. No. 09/268,902, Filed Mar. 16, 1999.

* cited by examiner

Primary Examiner—Kamini S Shah
Assistant Examiner—Suzanne Lo
(74) Attorney, Agent, or Firm—Christopher P. Maiorana, PC

(57) ABSTRACT

A method for analyzing an electrical characteristic of wire segments configured as one or more power meshes in an integrated circuit (IC) core comprising the steps of (A) specifying design information corresponding to the power meshes, (B) specifying at least one type of analysis to be performed, where the analysis comprises (i) generating a file corresponding to the IC core in a format compatible with an electronic circuit simulator and (ii) calculating the electrical characteristic of the wire segments via the circuit simulator, and (C) displaying the calculated electrical characteristic.

20 Claims, 9 Drawing Sheets

INSTANTANEOUS VOLTAGE DROP SENSITIVITY ANALYSIS TOOL (IVDSAT)

FIELD OF THE INVENTION

The present invention relates to simulating micro-integrated circuit performance generally and, more particularly, to an instantaneous voltage drop sensitivity analysis tool (IVDSAT).

BACKGROUND OF THE INVENTION

Conventional integrated circuit (IC) simulation tools implement layout data in a graphics data syntax (.gds) file extension format and typically call for the design to be design rules check (DRC) and layout versus schematic (LVS) clean. Conventional IC simulation tools also implement a netlist. The IC design will usually be finished and the layout complete before a voltage drop issue can be uncovered. This can be too late to permit an efficient design process. If the conventional tool is operated in a DC mode, the calculated and reported voltage drop of the IC power mesh will be over estimated since on-chip capacitance will not be considered. The voltage drop of the bond wire and package will be underestimated since the package and bond wire instantaneous voltage drop is a function of the instantaneous current change (i.e., dI/dT) which depends on the package and bond wire inductance. In a DC simulation, dI/dT is simulated as zero and the inductive effects are ignored. If an AC vector based simulation is executed, the capacitance and inductance can be evaluated. However, the simulation (i) can take several days to complete, (ii) will be extremely CPU intensive, and (iii) in some cases, is not practical. For most IC designs, conventional commercial simulations are not practical. Conventional tools (i) do not use voltage controlled current sources and (ii) overestimate the instantaneous voltage drop. As the core voltage drops, transistor gate and drain voltages drop and the output drive current is reduced. The drop in gate and drain voltages and drive current can cause inaccurate simulation results.

It would be desirable to have a method and/or architecture for simulating integrated circuit performance that provides (i) instantaneous voltage drop sensitivity analysis, (ii) simulation of on-chip capacitance and wire-bond inductance, and/or (iii) implementation independently of the circuit .gds file and/or netlist.

SUMMARY OF THE INVENTION

The present invention generally concerns a method for analyzing an electrical characteristic of wire segments configured as one or more power meshes in an integrated circuit (IC) core comprising the steps of (A) specifying design information corresponding to the power meshes, (B) specifying at least one type of analysis to be performed, where the analysis comprises (i) generating a file corresponding to the IC core in a format compatible with an electronic circuit simulator and (ii) calculating the electrical characteristic of the wire segments via the circuit simulator, and (C) displaying the calculated electrical characteristic.

The objects, features and advantages of the present invention include providing an instantaneous voltage drop sensitivity analysis tool (IVDSAT) that may (i) be implemented independently of a completed design netlist, (ii) be implemented independently of a completed layout design file such as a .gds extension format file, (iii) provide for AC or DC simulations or a combination of the two to be executed, (iv) implement any SPICE or other appropriate circuit simulator compatible current waveforms, (v) provide for capacitance zones that may overlap, (vi) provide for power zones that may overlap, (vii) provide for power zones that may overlap capacitance zones, (viii) provide for the generation of instantaneous voltage drop plots over simulation time for all resistors (or wire segments) in the circuit power mesh, (ix) provide for instantaneous voltage drop plots of the entire design to be generated at any instant in the simulation, (x) provide for instantaneous voltage drop plots to be combined to create an instantaneous voltage drop video display of the simulation, (xi) provide analysis of the effectiveness of on-chip capacitance with respect to instantaneous voltage drop reduction, (xii) provide for package and bond wire resistance, capacitance and/or inductance to be added to pad cells to evaluate the effect on instantaneous voltage drop, (xiii) provide for faster simulation times when compared to conventional approaches, (xiv) provide for easy modification of capacitance and power zones via the graphical user interface, (xv) provide for power zones and/or capacitance zones that may overlap themselves or each other, (xvi) provide for user modification, simulation, and/or display of the simulation results while remaining resident to the IVDSAT tool during the analysis, (xvii) provide for reading a .grd extension format file which is text based and very easy for the user to read and modify, (xviii) provide for a cross reference file from a SPICE (or other appropriate circuit simulator) generator to the IVDSAT such that referenced mesh resistors (or wire segments) and/or the corresponding instantaneous voltage drop versus simulation time plots may be easily located in the design, and/or (xix) provide a full resistance, capacitance, and/or inductance simulation engine.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
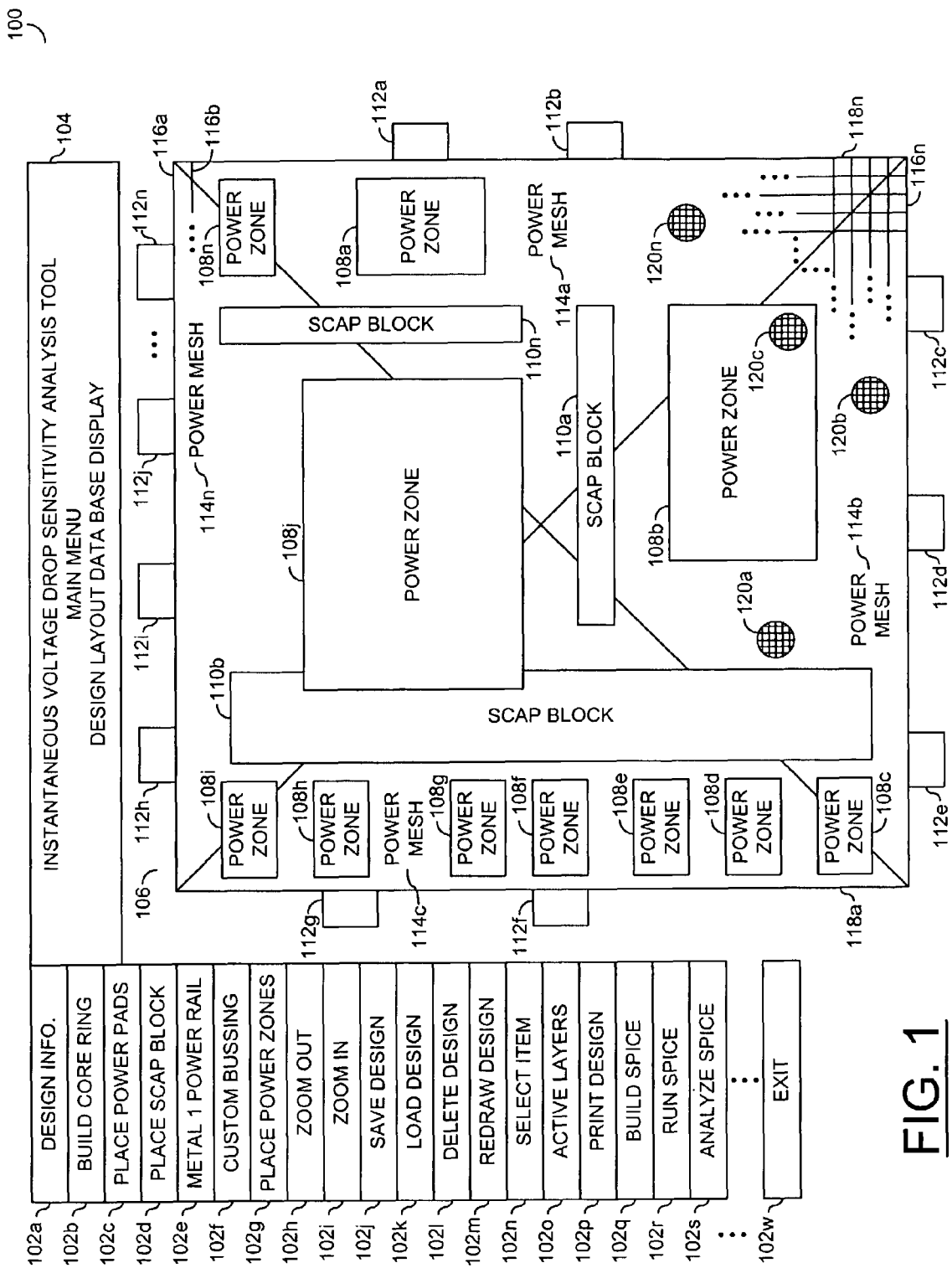
FIG. 1 is a diagram of a preferred embodiment of the present invention.

Referring to FIG. 1, a diagram illustrating a graphical user interface (GUI) 100 in accordance with the preferred embodiment of the present invention. The GUI 100 may correspond to a method (e.g., process, steps, etc.) for the implementation of an instantaneous voltage drop sensitivity analysis tool (IVDSAT). The GUI software interface 100 generally comprises a GUI window (e.g., video display, image, etc.) title bar 104, a plurality of control buttons (or icons) and/or drop down menus 102 (e.g., 102a-102w), and a design layout window (e.g., image, video display, etc.) 106. The design layout 106 generally defines an integrated circuit (IC) core having one or more electrical characteristics that may be calculated, analyzed, and/or displayed via the method 100 in connection with an appropriate electronic circuit simulator (e.g., SPICE). The present invention may be configured to provide a user a method and/or apparatus to define (e.g., specify, enter, generate, etc.) the design layout window 106 which generally comprises one or more power zones 108 (e.g., 108a-108n), one or more simulation capacitance (SCAP) blocks 110 (e.g., 110a-110n), one or more pad cells 112 (e.g., 112a-112n), one or more power meshes 114 (e.g., 114a-114n), a plurality of horizontal power busses 116 (e.g, power busses 116a-116n), a plurality of vertical power busses 118 (e.g., power busses 118a-118n), and/or one or more inter-level vias (or interconnects) 120 (e.g., 120a-102n). The power meshes 114 generally comprise grids formed as interconnections of the busses 116 and 118.

Two or more of the power zones 108 and/or the power meshes 114a-114n may be connected together by the vias 120. The GUI 100 generally corresponds to a multi-layer integrated circuit (IC) design. As such, the power meshes 114a-114n may be implemented at respective layers of the IC connected by one or more of the vias 120. The pad cells 112 are generally connected to respective power meshes 114 via the power busses 116 and 118 and/or power rails (not shown). The layout 106 parameters (e.g., the power zones 108, the SCAP blocks 110, the pads 112, power mesh 114, etc.) may be entered (i) manually through the graphical interface 100 or (ii) through an IVDSAT .grd extension format (or any appropriate format) input text file.

The IVDSAT 100 may be configured to provide the user the capability to specify, enter, change, move and/or edit the power zone 108, the capacitance zone 110, the pad cell 112, the power meshes 114, the power busses 116 and/or 118, the vias 120, etc. The commands implemented to manipulate (or control) the present invention may be incorporated as buttons (or icons) and/or drop down menus (e.g., the images 102a-102n), as shown on the left hand side of the screen shot 100. In one example, the GUI 100 may be configured to display the image 106 via color graphics. For example, the power zone 108 may appear yellow, the SCAP block 110 may appear royal blue, the power mesh 114 may appear red, black and dark blue, and the pad cell 112 may appear black. However, the GUI 100 may be configured to implement the window 106 with any appropriate color or monochrome display to meet the design criteria of a particular application.

The user generally activates the icons 102 of the present invention by a aligning cursor to the icon and clicking a mouse button or by other similar actions. The buttons 102a-102w may each correspond to a layered (or tiered) command structure. Each command that corresponds to an icon 102 may be configured as (i) a single layer (or level) of operation or (ii) as an upper level having options and/or more detailed commands. The icon 102a may be linked to a dialog box (or window) or configured to receive design information (e.g., circuit identification, product line, etc.) entered manually and/or downloaded as any appropriate file by the user.

The button 102b may be linked to a dialog box that may be configured to receive information that corresponds to one or more core rings (not shown) that may be configured to present one or more supply voltages to the power meshes 114a-114n. The icon 102c may be linked to a window that may be configured to receive information that corresponds to placing the power pad cells 112 (described in more detail in connection with FIG. 5c). The button 102d may be linked to a dialog box that may be configured to receive information that corresponds to placing the SCAP blocks 110 (described in more detail in connection with FIG. 5b).

The icon 102e may be linked to a window that may be configured to receive information that corresponds to a Metal 1 (e.g., first layer) power rail (not shown). Addition tiers (not shown) may be implemented to receive information that may correspond to additional (e.g., Metal 2, Metal 3, etc.) power rails as appropriate to meet the design criteria of a particular application.

The button 102f may be linked to a window that may be configured to receive information that corresponds to custom bussing. The custom bussing may comprise (i) editing one or more of the busses 116a-116n and/or 118a-118n and/or (ii) generating one or more new busses. The icon 102g may be linked to a dialog box that may be configured to receive information that corresponds to placing the power zones 108a-108n (described in more detail in connection with FIG. 5a).

The buttons 102h and 102i may be configured to provide the user a zoom out and a zoom in feature, respectively. The buttons 102h and 102i may provide the user more conventional viewing of the display 106 as appropriate for a given task. The icon 102j may be configured to save the current method 100 information in any appropriate storage medium (not shown, such as a hard disk drive). The icon 102k may be configured to load (or retrieve) a specific method 100 design from the storage medium.

The button 102l may be configured to delete a specified (or selected) IVDSAT 100 design from the storage medium. The icon 102m may be configured to initiate a redraw operation of a specified IVDSAT 100 design. The button 102n may be configured to select an item (e.g., a power zone 108, a SCAP block 110, etc.) that the user may have indicated via the cursor. The button 102o may be configured to initiate an indication on the display 106 of the layer and/or layers that are active in the current design of the IVDSAT 100. The indication may be a highlighting, a color change, a strobing, or any appropriate indication to meet the design criteria of a particular application.

The icon 102p may be configured to initiate a print (e.g., a hard copy) of the IVDSAT 100 design that is displayed as the image 106. The buttons 102q, 102r, and 102s may be configured to build (or construct), execute, and analyze a SPICE (or any appropriate electronic circuit simulator) simulation file. When each stage of the SPICE simulation and analysis is complete, the IVDSAT 100 generally provides the user an indication (not shown) on the display 106. The analysis that is generated in response to the icon 102s may be implemented to generate one or more instantaneous voltage drop plots for each resistor (or wire segment) in the power mesh 114 via the IVDSAT 100 (shown in connection with FIG. 6).

Figure 2A:
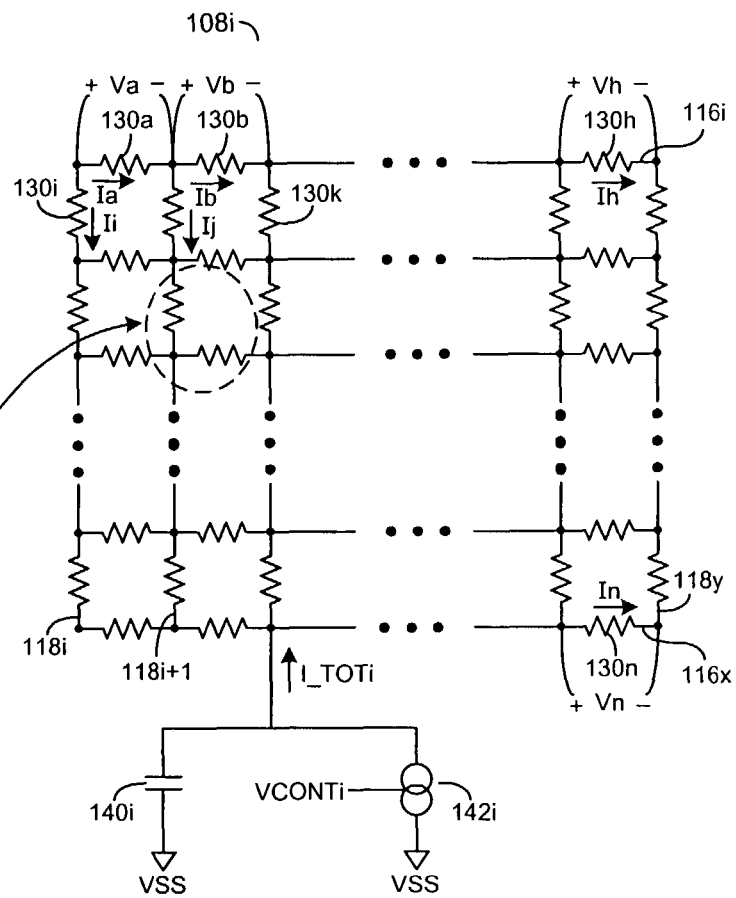
FIG. 2 is a diagram of a power zone of the present invention.

Referring to FIGS. 2(a-b), diagrams illustrating a power zone 108 of the present invention are shown. A power zone 108i may be defined by IC coordinates (to be described in more detail in connection with FIG. 5a) that correspond to a section of a respective power mesh 114 bounded between horizontal power busses 116i-116x and vertical power busses 118i-118y.

Figure 2B:
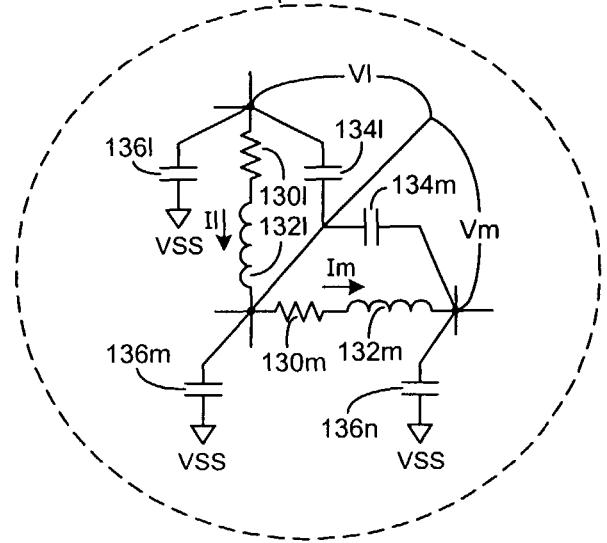

As shown in detail in FIG. 2b, each intersection of the power busses 116 and 118 generally forms a node. The respective wire segments of the power busses 116 and 118 defined by the intersections of the busses 116 and 118 may be simulated comprising a resistance 130 (e.g., resistors 130a-130n), an inductance 132 connected in series with the resistance 130 (e.g., inductors 132a-132n), and a capacitance 134 connected in parallel with the respective resistance 130 and/or inductance 132 (e.g., capacitance 134a-134n). In addition, each intersection (or node) of the busses 116 and 118 may be simulated comprising a capacitance 136 that may be connected to a ground potential (e.g., the capacitance 136a-136n connected to VSS). In one example, the power zone 108i may present a capacitance 140i to the circuit ground potential VSS. While only two examples are shown, the respective inductance 132 and/or the respective capacitances 134 and/or 136 may be specified for each respective wire segment 130 of a design 106 (e.g., any power zone 108 and/or power mesh 114). The power mesh 114 segments are generally configured as the resistance 130, the inductance 132, the capacitance 134, and/or the capacitance 136.

The power zone 108i may receive a current (e.g., I_TOT) presented by a current source 142i. The current source 142i may be implemented as a voltage controlled current source. The current source 142i may have a control input that may receive a control voltage (e.g., VCONTi). The value of the current I_TOT may depend on the voltage supplied (or presented) to the current source 142i by the power busses 116 and/or 118 as the signal VCONT. The current source 142i may be configured to generate any appropriate waveform that is compatible with the electronic circuit simulator (e.g., SPICE) that is implemented in connection with the IVDSAT 100.

A current (e.g., Ia-In) may flow through each respective resistor 130a-130n (and/or inductance 132a-132n). The flow of the current I through the wire segment (or resistor) 130 generally causes a respective voltage drop (e.g., Va-Vn) across the resistor 130. In one example, the IVDSAT 100 may be configured to calculate and display the voltage V as an instantaneous voltage drop. In another example, the IVDSAT 100 may be configured to calculate and display the voltage V as an average value. In yet another example, the IVDSAT 100 may be configured to calculate and display the voltage V as a root-mean-square (RMS) value.

Figure 3A:
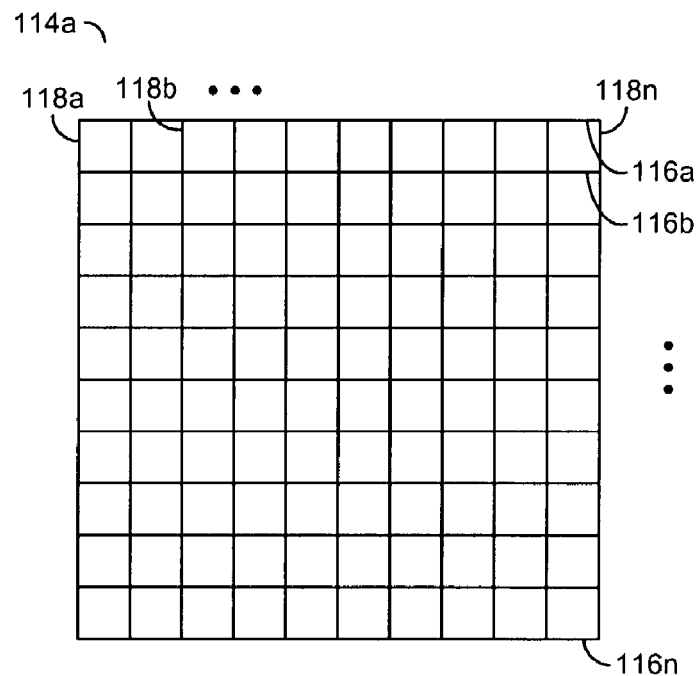
FIGS. 3(a-c) are diagrams of example embodiments of power meshes of the present invention.
Figure 3B:
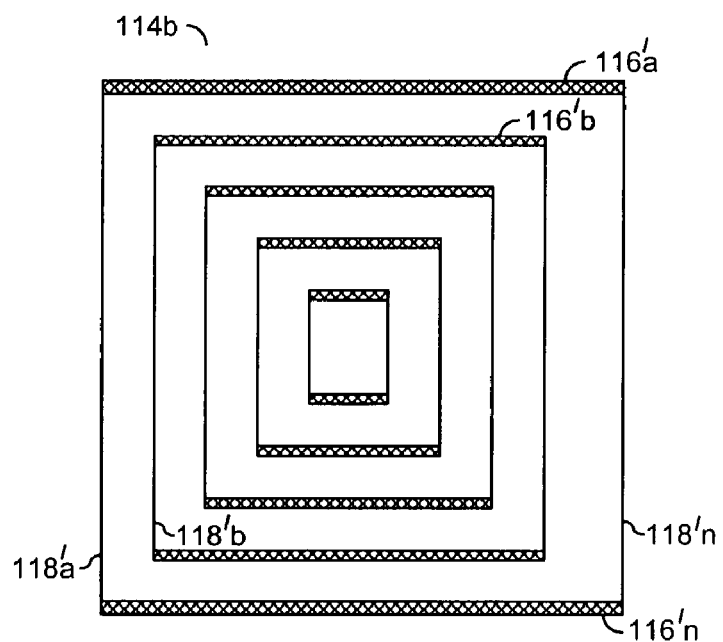

Referring to FIGS. 3(a-c), diagrams illustrating example embodiments of the power mesh 114 are shown. In one example (shown in FIG. 3a), the circuit 114a may be implemented as a power mesh comprising a substantially rectangular grid of horizontal power busses 116a-116n and vertical power busses 118a-118n that may intersect (and generate a respective resistance 130) in a "checkerboard" pattern.

In another example (shown in FIG. 3b), the circuit 114b may be implemented as a power mesh configured as a number of essentially concentric rectangles of horizontal power busses 116'a-116'n intersected by vertical power busses 118'a-118'n. The power mesh 114b also illustrates an example circuit where selected power busses (e.g., the horizontal busses 116'a-116'n) are sized larger (e.g., wider) than other power busses (e.g., the vertical busses 118'a-118'n) to meet power capacity design criteria of a particular application.

In yet another example (shown in FIG. 3c), the circuit 114c may be implemented having each quadrant configured as a successive series of "L" shapes such that the circuit 114c may be configured as a number of essentially concentric "+" shapes. The horizontal busses 116"a-116"n and the vertical busses 118"a-118"n may be continuous for a first bus (e.g., the busses 116"a and 118"a), an intermediate bus (e.g., the busses 116"i and 118"i), and a last bus (e.g., the busses 116"n and 118"n). However, the power meshes 114a-114n may be implemented having any appropriate configuration to meet the design criteria of a particular application.

Figure 4:
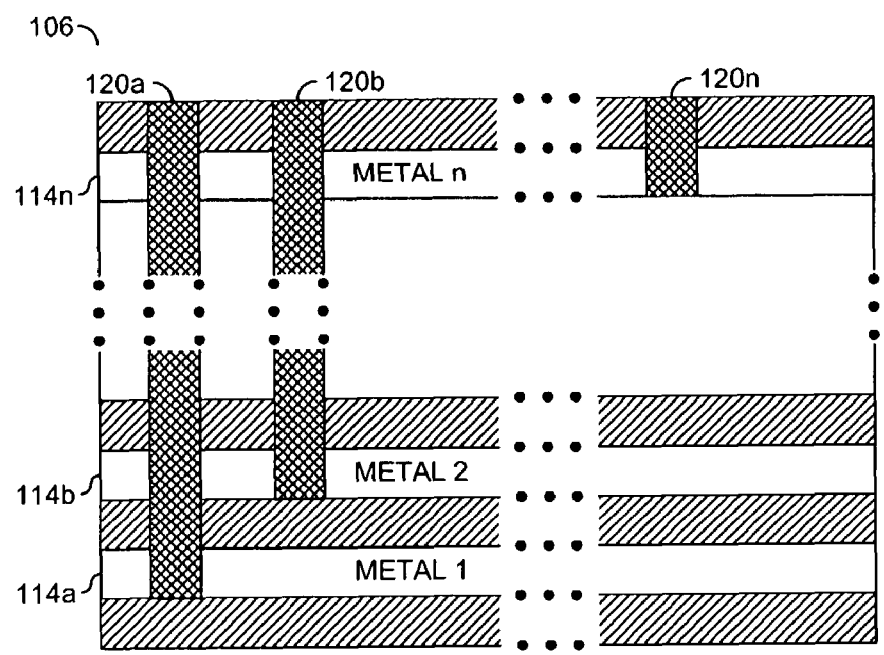
FIG. 4 is a diagram of a cross section of a design layout of the present invention.

Referring to FIG. 4, a diagram illustrating a cross sectional view of the circuit layout 106 is shown. One or more additional circuit layers (e.g., substrate layers, insulating layers, etc.) generally separate the power meshes 114a-114n. While the via 120a is shown providing an external connection path for the power meshes 114a-114n, the via 120b is shown providing an external connection path for the power meshes 114b-114n, and the via 120n is shown providing an external connection path for the power mesh 114n, the vias 120a-120n may be configured to provide any appropriate interconnection to meet the design criteria of a particular application. A respective resistance value (not shown) may be specified in the circuit layout 106 for each via 120. The external connection paths provided by the pads 112 and/or the vias 120 may be connected to one or more package pins (not shown).

Figure 5A:
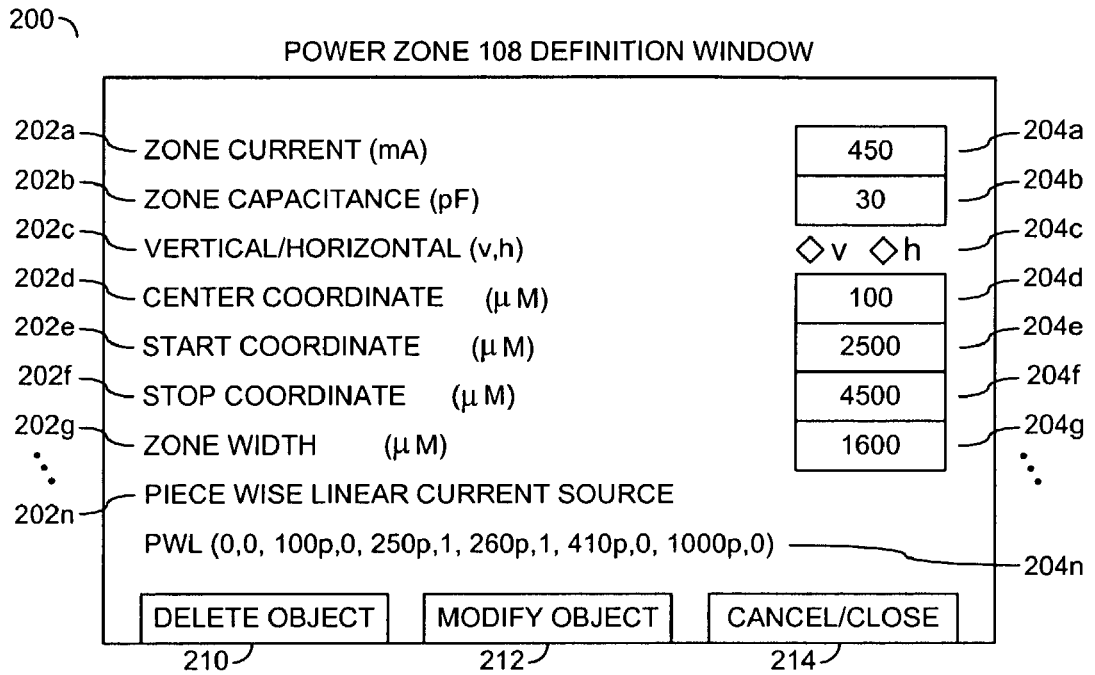
FIGS. 5(a-c) are diagrams of a power zone definition window, a SCAP block definition window, and a pad cell definition window, respectively, of the present invention.

Referring to FIG. 5a, a screen shot (or image) illustrating a power zone 108 definition (or dialog box) window 200 is shown. The power zone 108 definition window 200 generally comprises one or more power zone 108 parameter description (or design information) blocks 202 (e.g., blocks 202a-202n) each having a respective input field 204 (e.g., fields 204a-204n), a delete object button 210, a modify object button 212, and a cancel/close window button 214. The block 202a and the field 204a may correspond to the current I_TOT value (as generated by the respective voltage controlled current source 142) that relates to the selected power zone 108. The block 202b and the field 204b may correspond to the capacitance value 140 that relates to the selected power zone 108. The blocks 202c-202g and fields 204a-204g may correspond to chip layout and dimension parameters (e.g., vertical or horizontal orientation, center location coordinates, zone 108 start/stop and width coordinates, etc.) and the respective values that relate to the selected power zone 108.

The block 202n and the field 204n may correspond to a piece wise linear description (or definition) of the current I_TOT over the simulation time. The piece wise linear approximation definition of the current I_TOT via the present invention may provide the user a method for more accurately calculating (or determining) the instantaneous voltage drop V values over the simulation time than conventional simulation approaches. In one example, the piece wise linear definition of the current source 142 may be implemented via a SPICE (or any appropriate electronic circuit simulator) correction feature. The design parameters (or values) 204a-204n generally provide the definition of the power zones 108.

The icons (or buttons) 210, 212 and/or 214 may be configured to provide the user a convenient and easy method to manipulate common simulation design tasks (e.g., deletion and/or modification of the power zones 108 and cancel/close of the window 200). However, the image 200 may be implemented having any appropriate configuration to meet the design criteria of a particular application.

Figure 5B:
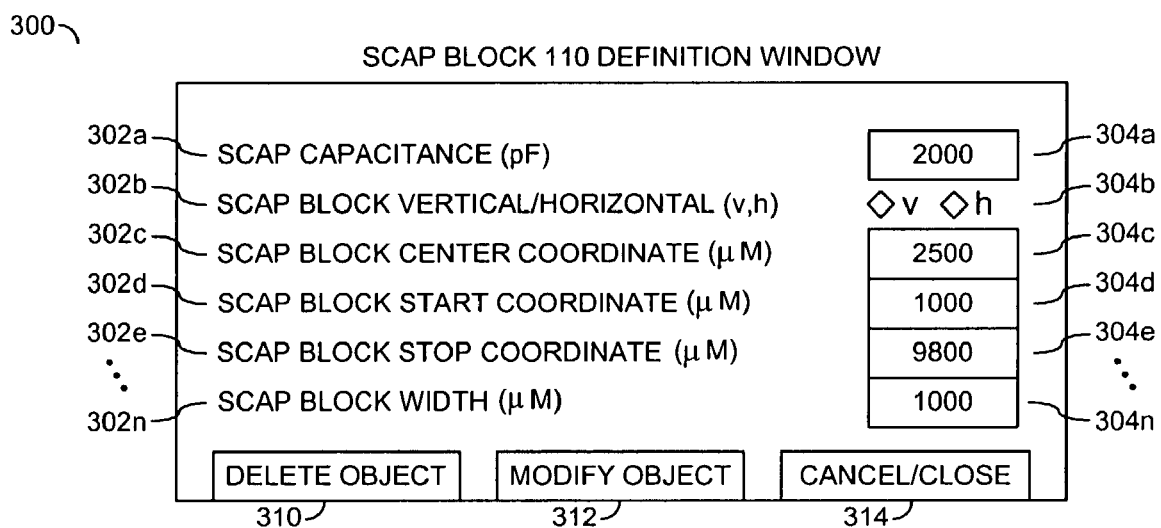

Referring to FIG. 5b, a screen shot (or image) illustrating a SCAP block 110 definition window (or dialog box) 300 is shown. The SCAP block 110 definition window 300 generally comprises one or more SCAP block 110 parameter description (or design information) blocks 302 (e.g., blocks 302a-302n) each having a respective input field 304 (e.g., fields 304a-304n), a delete object button 310, a modify object button 312, and a cancel/close window button 314. The block 302a and the field 304a may correspond to the capacitance value that relates to the selected SCAP block 110. The blocks 302b-302n and fields 304b-304n may correspond to chip layout and dimension parameters (e.g., vertical or horizontal orientation, center location coordinates, block start/stop and width coordinates, etc.) and the respective values that relate to the selected SCAP block 110. The design parameters (or values) 304a-304n generally provide the definition of the SCAP blocks 110.

The buttons (or icons) 310, 312 and 314 may be implemented similarly to the buttons 210, 212 and 214, respectively. However, the video display 300 may be implemented having any appropriate configuration to meet the design criteria of a particular application.

Figure 5C:
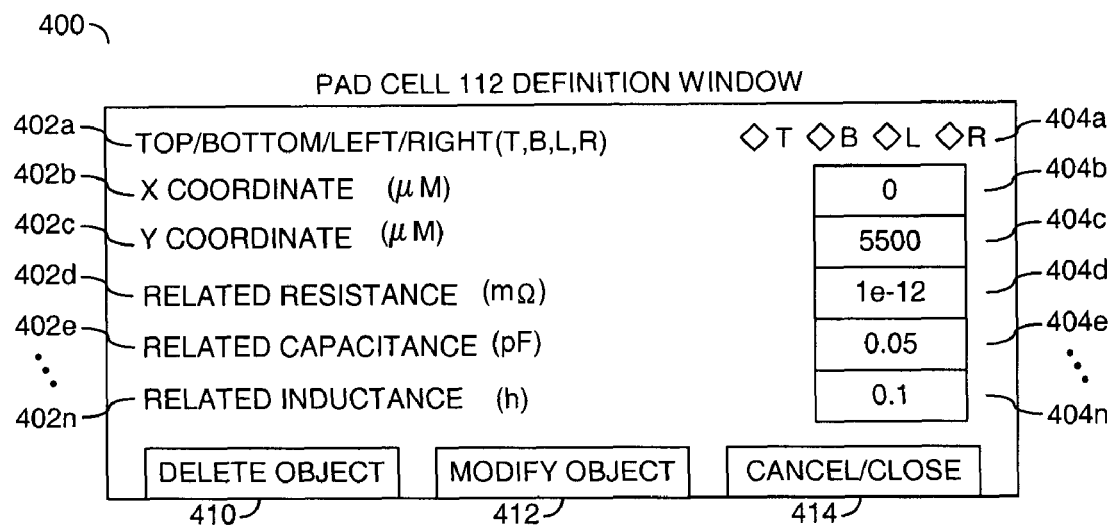

Referring to FIG. 5c, a screen shot (or image) illustrating a pad cell 112 definition window 400 is shown. The pad cell 112 definition window 400 generally comprises one or more pad cell 112 and related package and wire bond parameter description (or design information) blocks 402 (e.g., blocks 402a-402n) each having a respective input field 404 (e.g., fields 404a-404n), a delete object button 410, a modify object button 412, and a cancel/close window button 414. The blocks 402a-402c and fields 404a-404c may correspond to chip layout and dimension parameters (e.g., top/bottom/left/right cell 112 placement, cell placement coordinates, etc.) and respective values that relate to the selected pad cell 112. The package may be a suitable material that protects the integrated circuit from an environment. The wire bonds may be interconnects between the pad cells of the integrated circuit and conductors of the package.

The block 402d and the field 404d may correspond to a package and bond wire resistance that relates to the selected (or respective) pad cell 112. The block 402e and the field 404e may correspond to a package and bond wire capacitance that relates to the respective pad cell 112. The block 402n and the field 404n may correspond to a package and bond wire inductance that relates to the selected (e.g., respective) pad cell 112. Each pad cell 112 generally has corresponding unique values for the related package and bond wire resistance 404d, the related package and bond wire capacitance 404e, and the related package and bond wire inductance 404n. The related package and bond wire resistance 404d, the related package and bond wire capacitance 404e, and/or the related package and bond wire inductance 404n specified in the respective pad 112 fields may provide a method (e.g., the IVDSAT 100) for more accurately calculating (or determining) the instantaneous voltage drop V values over the simulation time than conventional approaches. The design parameters (or values) 404a-404n generally provide the definition of the respective pad cells 112 and the corresponding package and bond wire resistance, capacitance and inductance.

The buttons (or icons) 410, 412 and 414 may be implemented similarly to the buttons 210, 212 and 214, respectively. However, the image 400 may be implemented having any appropriate configuration to meet the design criteria of a particular application.

One or more additional windows (or dialog boxes) (not shown) are generally implemented in the IVDSAT 100 such that other user specified (e.g., defined, selected, etc.) parameters that relate to core rings (not shown), power rails (not shown), custom busses (not shown), power meshes 114a-114n, vias 120a-120n, wire segments 130a-130n, etc. may be entered. The additional windows may be implemented similarly to the windows 200, 300, and/or 400. For example, each of the vias 120a-120n (and the corresponding package pin) may have a respective window (or dialog box) where the user may specify (or enter) a resistance value that may correspond to an interconnection resistance (e.g., a resistance between the power zones 108 and/or power meshes 114 that are interconnected by the respective via 120).

The IVDSAT 100 may be configured to provide full resistance, capacitance, and/or inductance (RCL) simulation values (or parameters) for pad cells 112 and the corresponding package and wire bond resistances, capacitances and inductances, power meshes 114, vias 120 (and the corresponding package pins), the wire segments 130, etc. The method 100 may be configured as a full RCL simulation engine. The simulation engine 100 may be implemented having user specification and/or entry of any appropriate parameters 202, 302, etc. and/or values 204, 304, etc. to meet the design criteria of a particular application.

The method 100 may be implemented such that (i) two or more of the power zones 108 may be overlapped, (ii) two or more of the SCAP capacitance zones 110 may be overlapped, and/or (iii) one or more of the power zones 108 may overlap one or more of the SCAP blocks (or zones) 110. Each power mesh 114 is generally configured at a respective layer (e.g., Metal 1, Metal 2, etc.) of the IC (or chip). One or more of the design information parameters (e.g., information specified and/or entered in the input fields 204, 304, 404, etc.) may be varied such that a user may perform a sensitivity analysis on the voltage drop V. Similarly, a sensitivity analysis may be performed in response to any current I_TOT waveforms over the simulation time.

Figure 6:
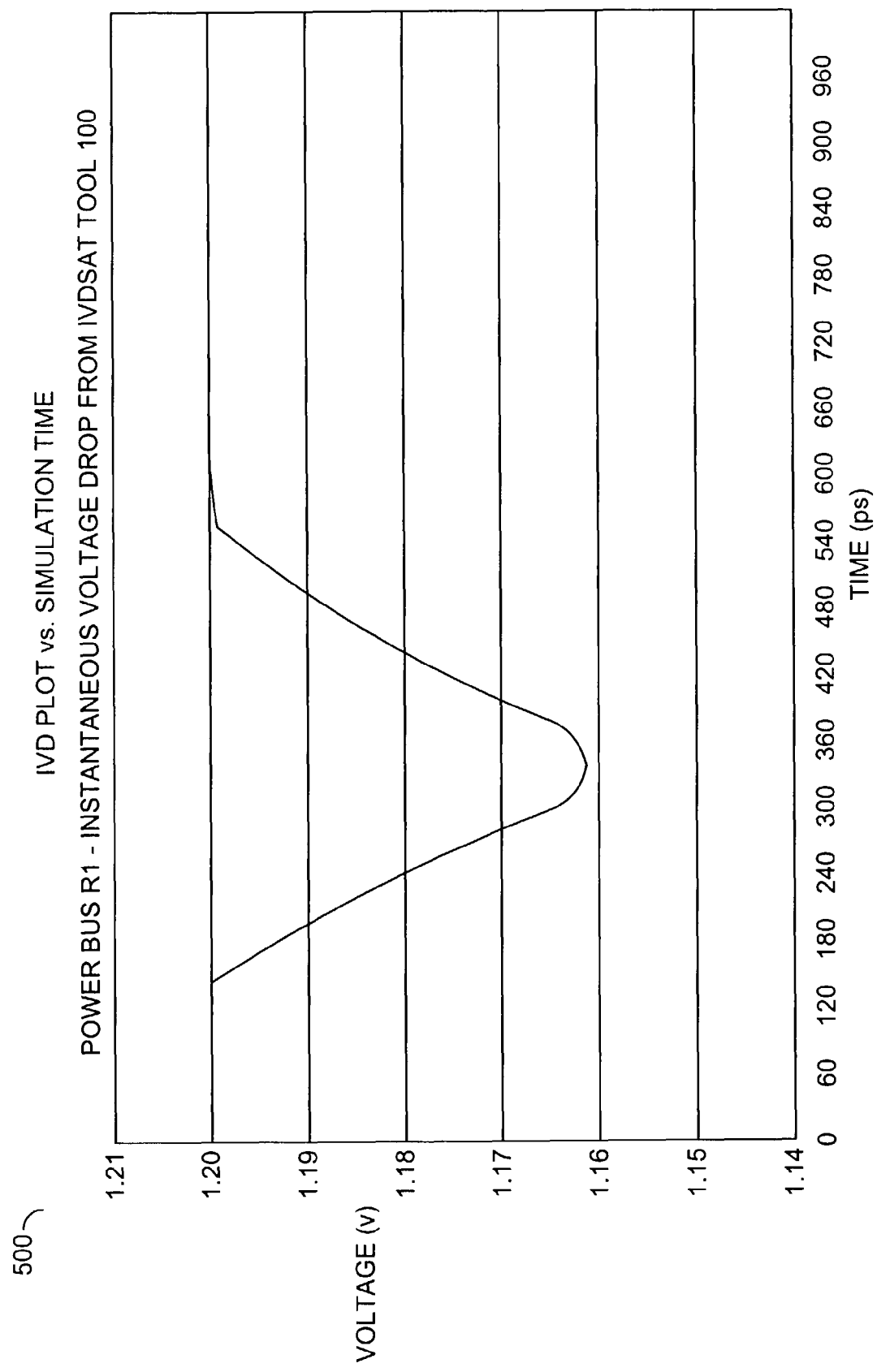
FIG. 6 is an example of an IVD versus time plot.

Referring to FIG. 6, a screen shot (e.g., image, video display, etc.) of an instantaneous voltage drop V versus simulation time plot 500 is shown. Each plot 500 generally corresponds to the voltage V at each selected wire segment (or resistor 130). The plot 500 may be generated by the tool 100 when the user selects the appropriate analysis over any applicable fixed value and/or range of voltage, current, and/or time. The plot 500 may be implemented as a portion of the analysis tool 100. A number of the plots 500 may be combined to provide a real time display as a streaming video image (or movie) of the instantaneous voltage drop V at any selected resistor (or wire segment) 130. The method (or IVDSAT) 100 of the present invention may be configured to generate DC, AC or a combination of DC and AC simulations such that the plots 500 may be calculated (or determined) for any appropriate operating states (or conditions) to meet the design criteria of a particular application.

Figure 7A:
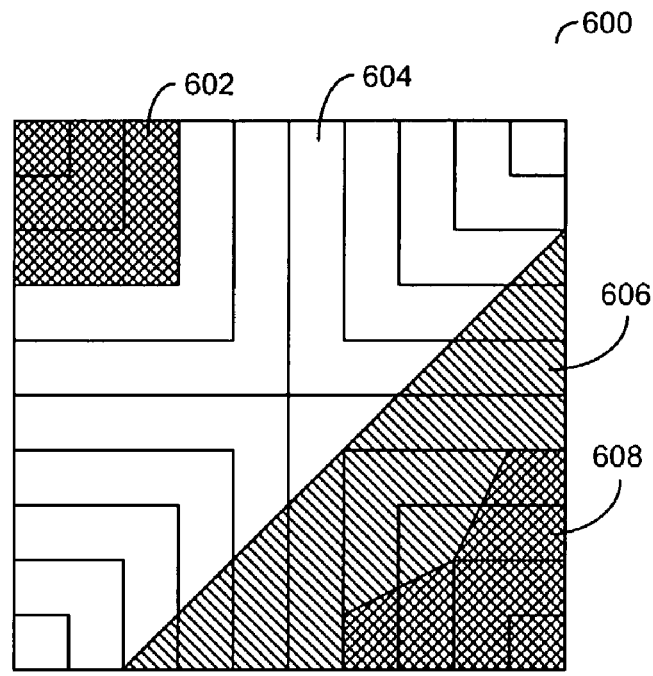
FIGS. 7(a-c) are diagrams power mesh voltage levels over time.

Referring to FIGS. 7(a-c), diagrams 600 illustrating a screen shot (e.g, image, video display, etc.) of the instantaneous voltage on all of the wire segments 130 of the power mesh 114 over time are shown. The images 600 may be generated via the IVDSAT 100. Each diagram 600 generally illustrates a voltage drop pattern as voltage levels indicating a percentage of instantaneous voltage drop relative to the applied (e.g., supply) voltage at a particular time. In one example (as shown in FIG. 7a), the instantaneous voltage levels Va-Vn at a first time may comprise patterns (or iso-voltages) 602, 604, 606, and 608. The image 600 generally represents a topological graph of the instantaneous voltage V at a point (or instant) in time.

For example, the patterns (or regions) 602 and 608 may represent sections (or portions) of the power mesh 114 where the instantaneous voltage V across the wire segments 130 is less than 5% below the supply voltage. The region 604 may represent a section of the power mesh 114 where the instantaneous voltage V is more than 5% but less than 10% below the supply voltage. The section 606 may represent a region of the power mesh 114 where the voltage drop level V is greater than 10% below the supply voltage. In another example, the regions 602, 604, 606 and 608 may represent absolute voltage drop levels. However, any appropriate delineation of regions of instantaneous voltage V may be implemented to meet the design criteria of a particular application.

The regions 602 and 608 may represent portions of the power mesh 114 where the instantaneous voltage drop V is sufficiently low such that operation of components implemented in the design 106 in connection with the power mesh 114 is not impaired and/or compromised. The power mesh 114 and busses 116 and 118 may be adequately sized and/or over-sized. A designer may perform additional analysis (e.g., execute additional analysis via the IVDSAT 100) to determine if the respective power mesh 114 may be varied (e.g., the width and/or thickness of the busses 116 and 118 may be adjusted) in response to the image 600.

Similarly, the region 604 and/or 606 may represent areas of the power mesh 114 where the instantaneous voltage drop V is to a level such that respective component operation may be impaired and/or comprised. The designer may perform additional analysis via the IVDSAT 100 in response to the video display 600.

While the regions (e.g., 602, 604, etc.) of the video display 600 are illustrated in mono-chrome, in an alternative embodiment the regions 602, 604, etc. may be displayed (e.g., as the image 106) in a variety of respective colors. For example, an area such as the regions 602 and 608 where instantaneous voltage V may be sufficiently high for the particular design under analysis may be displayed in green or uncolored. The regions 604 where the instantaneous voltage V may be marginal and/or inadequate may be displayed in amber. The region 606 where the instantaneous voltage V is generally inadequate may be displayed in red. However, any appropriate color, shading, stippling, etc. may be implemented to delineate the regions of the display 600 to meet the design criteria of a particular application.

Figure 3C:
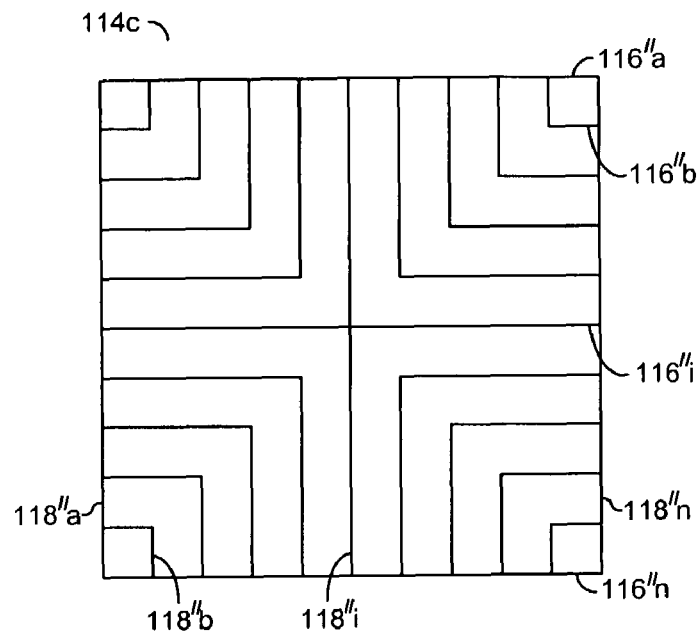

While the diagram 600 is shown having a power mesh 114 that is implemented similarly to the power mesh 114c of FIG. 3c, any appropriate power zone 108 and/or power mesh 114 may be generated and displayed via the IVDSAT 100 to meet the design criteria of a particular application.

Figure 7B:
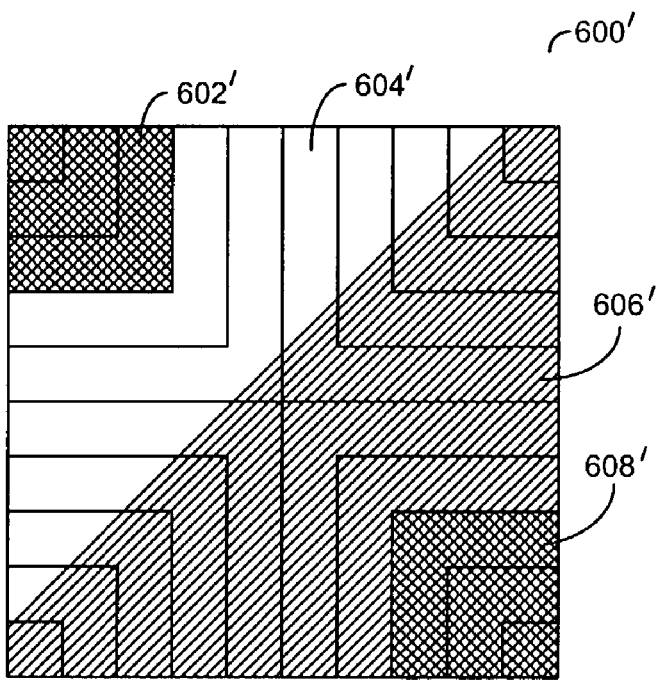
Figure 7C:
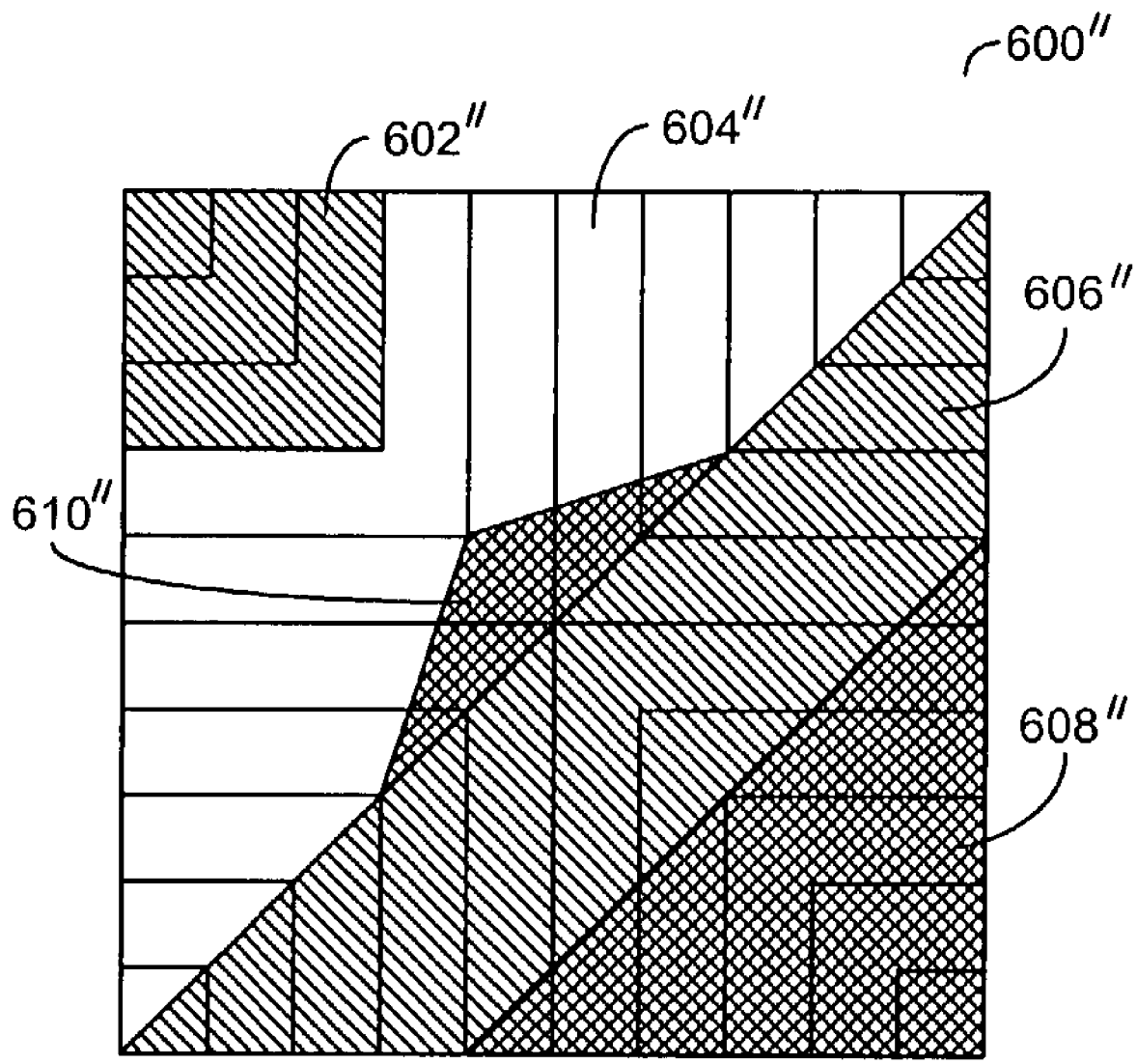

Referring to FIGS. 7b and 7c, diagrams 600' and 600", respectively, illustrating instantaneous voltage V at other (generally subsequent) instants in time are shown. The size and/or shapes of the regions 602, 604, etc. generally change over time since the IVDSAT is generally implemented to provide a full RCL simulation for DC, AC and/or AC/DC analyses. Additionally, new regions (e.g., the region 610" of FIG. 7c) may be generated during the simulation of the system 100. The instantaneous voltage V in a region may change. For example, the region 602" may represent the transition of a marginal voltage drop to a voltage drop that represents an inadequate instantaneous voltage level V over time.

In one example, the still images 600 may be provided for analysis by a designer (or user). In another example, a mode of operation of the IVDSAT 100 may be executed (or implemented) where a number of the plots 600 are combined to provide a real time display as a streaming video image (or movie) of the instantaneous voltage drop V over a selected time period for any appropriate design 106 (e.g., power zone 108, power mesh 114, etc.). The displays 600 may be generated by the tool 100 for any appropriate user selected (e.g., determined, entered, etc.) fixed value and/or range of voltage, current and/or time. The IVDSAT 100 may be configured to generate DC, AC or a combination of DC and AC simulations such that displays 600 may be calculated (or determined) for any appropriate operating states (or conditions) to meet the design criteria of a particular application.

The present invention may provide a quick and easy to use instantaneous voltage drop simulation tool (e.g., the IVDSAT 100) at the design floor plan level. The simulations generated via the present invention may be based on AC or DC analyses, or a combination of both. The present invention may simulate a design power mesh 114 having (i) on-chip capacitance 110 and (ii) package and bond wire resistance, capacitance, and/or inductance (e.g., the values specified and/or entered in the fields 404d-404n) through the implementation of (i) a graphical user interface (GUI) (e.g., the GUI 100) or (ii) a user input file. The simulation tool 100 of the present invention may be configured to operate without a design netlist or full circuit layout description (e.g., a .gds extension format file). Voltage dependent current sources 142 may be implemented to provide more accurate instantaneous voltage drop values (e.g., the voltage drop V) results when compared with conventional approaches. The present invention may be implemented as an instantaneous voltage drop sensitivity analysis tool (IVDSAT).

The present invention may simulate the design 106 (e.g., power mesh 114, etc.) at the time the design concept is conceived. In one mode of operation, AC simulations may be executed very quickly without a .gds format (or syntax) layout file and/or a netlist. In other modes of operation, DC, piecewise linear, and/or any other waveform compatible with a circuit analysis program such as SPICE may be implemented. In yet another mode of operation, DC and AC analyses may be combined in a single simulation. In one example, simulation times for the present invention may be less than an hour, whereas conventional approaches may take days. On-chip capacitance 110 may be added to the IVDSAT simulation 100, as well as package and/or bond wire resistance, capacitance, and/or inductance (e.g., the fields 404d-404n) via the pad cell 112 definition. The present invention may provide full RCL simulations for any appropriate parameters (e.g., power zones 108, pads 112, power meshes 114, wire segments 130, etc.).

The graph 500 of the instantaneous voltage drop V waveform over simulation time may be generated for every resistor (or wire segment) 130 in the power mesh 114. The simulation tool 100 of the present invention may be very useful for the analysis of inductive ring effects on the power mesh 114. In one mode of operation, the graphics snap shot plot 500 may be generated for every time step (or instant) in the simulation performed via the present invention. In another mode of operation, the plot 500 may be generated at selected time steps. A portion or all of the snap shots 500 may be combined to generate a real time animated video display (or movie) that depicts instantaneous voltage drop V over the simulation time. The voltage dependent current sources 142 may be implemented to provide more accurate instantaneous voltage drop V results and may reduce the number of iterations needed to reduce the instantaneous voltage drop V to an acceptable level when compared to conventional approaches.

A portion or all of the snap slots 600 may be combined to generate a real time animated video display (or movie) that depicts instantaneous voltage V over the simulation time. The movie generated via the IVDSAT 100 that is configured from a combination of the images 600 may provide a user a topological graphical display (e.g., iso-voltage regions 602, 604, etc.) that may provide an indication of areas of the design 106 (e.g., the power zones 108, power meshes 114, etc.) to be considered for additional design revision and/or analysis.

The design 106 parameters and respective values such as the power zone 108, the SCAP 110, the pad cell 112, the power mesh 114, etc. may be entered (i) manually through the graphics interface 100 or (ii) through an input file (e.g., a file having a format or syntax with a .grd extension). The power mesh 114 input file may contain all of the design information necessary to generate the power mesh 114. Similarly, each input file (or files) may contain all of the design information for the respective parameters (e.g., power zone 108, SCAP block 110, etc.). The IVDSAT 100 may be configured such that a user may specify, enter, change, move and/or edit the power zone 108, the pad cell 112, the capacitance zone 110, the power mesh 114, or the power busses 116 and/or 118, etc.

The tool 100 implemented via the present invention may generate (or translate from the .grd format) a Simulation Program with Integrated Circuit Emphasis (SPICE) or other appropriate electronic circuit simulator deck that corresponds to the IC design 106 and may execute AC or DC analyses, or both, simultaneously. The present invention may retrieve the simulator results and generate the graphics displays 500 and/or 600 of instantaneous voltage drop V across the design nodes (e.g., across any selected ones of the wire segments 130a-130n). The user may generate a plot 500 and/or a topological graph 600 of instantaneous voltage drop V over the simulation time for every resistor 130a-130n in the power zone 108a-108a and/or power meshes 114a-114n via the present invention.

The present invention may be advantageously implemented for evaluating inductance and inductive ringing or the impact of inductance on instantaneous voltage drop V. The user may generate an instantaneous voltage drop V plot 500 or snap shot 600 of the design at every instant during the simulation time. The plots 500 and/or snap shots 600 may be combined into a respective real time instantaneous voltage drop V animated video display (or movie) of the entire simulation. Features such as on-chip capacitance 110, package and/or wire bond resistance 404d, package and/or wire bond capacitance 404e, inductance (e.g., package and/or wire bond inductance 404n, wire segment 130 inductance 132, etc.), AC simulations, capacitance zones 110, node-to-node capacitance 134, node-to-ground potential capacitance 136, power zone capacitance 140, voltage dependent current sources 142, instantaneous voltage V drop snap shots 500 and/or 600, instantaneous voltage drop V movies, and/or instantaneous voltage V drop plots 500 and/or images 600 versus simulation time for each wire segment 130 in the mesh 114 may be generated with the tool 100 of the present invention.

The present invention may be configured to work independently of a completed design netlist and independently of a completed design file having a .gds extension syntax (or format). The circuit design 106 implemented via the IVDSAT 100 may provide for AC or DC simulations or a combination of the two to be generated (e.g., calculated, determined, etc.). The present invention may be configured to implement any SPICE (or other appropriate electronic circuit simulator) compatible current waveforms.

The circuit design layouts 106 generated (or entered) in the IVDSAT 100 may (i) permit capacitance zones 110 to overlap, (ii) permit power zones 108 to overlap, and/or (iii) permit power zones 108 to overlap capacitance zones 110. The IVDSAT 100 may be configured to provide IVD plots 500 and/or images 600 over the simulation time that may be generated for all resistors (or wire segments) 130 in the mesh 114. IVD plots 500 and/or images 600 of the entire design 106 may be generated at any instant in the simulation time. A number of the IVD 500 plots and/or images 600 may be combined to generate an IVD movie (or animated video display) of the simulation for any selected resistors (or wire segments) 130. The method 100 may provide the user a tool to study the effectiveness of on-chip capacitance (e.g., the capacitance zones 110, the power zone capacitance 140, etc.) with respect to IVD reduction. The present invention may be configured to implement package and bond wire resistance, capacitance and/or inductance that corresponds to the pad cells 112 via information entered into the respective fields 404d-404n to provide the user a tool to evaluate the respective effect on IVD. The present invention may be implemented as a full RCL simulation tool.

The present invention may provide faster simulation times than conventional approaches. The present invention may be configured such that power zones 108, capacitance blocks 110, etc. are easily modified through the graphical user interface 100 (e.g., the windows 200, 300, etc.). The IVDSAT 100 may be configured such that the user may modify, simulate and/or display the simulation results while remaining resident to the tool 100 during the analysis. The present invention may be configured such that one or more files generated and/or entered via the method 100 (e.g., files having a .grd extension) may be text based and very easy for the user to read and modify. The present invention may be configured to provide a cross reference (or translation) file from SPICE (or any appropriate simulator) to the IVDSAT 100 (and/or vice versa). The cross reference file may be generated when referencing mesh 114 resistors (or wire segments) 130 and/or IVD versus simulation time plots 500 and/or images 600 such that a user may easily find the resistor 130 or the voltage V location in the method 100 design.

While the present invention has been described in connection with a SPICE circuit simulator, any appropriate circuit simulator (e.g., ECAP, PROTEUS, Gnucap, SIMEtrix, a user-generated circuit simulator, etc.) may be implemented to meet the design criteria of a particular application.

The function performed by the (IVDSAT, method, apparatus, process, etc.) of FIGS. 1-7 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, and magneto-optical disks, ROMs, RAMs, EPROMs, EEPROMs, Flash memory, magnetic or optical cards, or any type of media suitable for storing electronic instructions.

As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the spirit and scope of the invention.

The invention claimed is:

1. A method for analyzing an electrical characteristic of a simulation of wire segments configured as a plurality of power meshes to be used in an integrated circuit (IC) core, comprising the steps of:

(A) specifying a network of power busses corresponding to said power meshes;

(B) specifying at least one type of analysis to be performed, wherein said analysis comprises (i) generating during said analysis a first file corresponding to said IC core in a format compatible with an electronic circuit simulator and (ii) calculating said electrical characteristic of said wire segments via said electronic circuit simulator, wherein (i) said IC core as represented in said first file comprises (a) one or more capacitance zones and (b) a plurality of pad cells connected to respective ones of said power meshes and (c) one or more power zones, (ii) each of said power meshes resides on a different conductive layer of said IC core, (iii) each of said power zones is bounded between a respective two horizontal busses of said power busses and a respective two vertical busses of said power busses in a respective one of said power meshes and (iv) each of said capacitance zones comprises (a) a respective capacitance value, (b) a respective physical orientation and (c) a respective physical width;

(C) displaying said electrical characteristic as calculated to a user;

(D) allowing said user to vary (i) a plurality of package and wire bond resistances connected to said pad cells, (ii) a plurality of package and wire bond capacitances connected to said pad cells and (iii) a plurality of package and wire bond inductances connected to said pad cells via a graphical user interface; and (E) allowing said user to vary respective current values within said power zones via said graphical user interface.

2. The method according to claim 1, wherein said electrical characteristic of said power mesh as calculated comprises an instantaneous voltage drop (IVD) sensitivity analysis.

3. The method according to claim 1, wherein step (A) further comprises specifying said power mesh via said graphical user interface.

4. The method according to claim 1, wherein (i) said specifying does not require implementation of a second file having a.gds extension format or a netlist and (ii) said method is capable of working independently of a completed design netlist and a completed.gds extension format design file.

5. The method according to claim 1, wherein said simulation provides a combination of both an AC analysis and a DC analysis in parallel.

6. The method according to claim 1, wherein said IC core further comprises one or more vias connected to one or more of said power meshes, each of said vias having a respective via resistance value adjustable by said user through said graphical user interface.

7. The method according to claim 1, wherein two or more of said capacitance zones are configured to overlap.

8. The method according to claim 1, wherein two or more of said power zones are configured to overlap.

9. The method according to claim 1, wherein one or more of said power zones overlap one or more of said capacitance zones.

10. The method according to claim 2, wherein said method further comprises the step of:
calculating said IVD over a simulation time for all of said wire segments.

11. The method according to claim 2, wherein said method further comprises the step of:
generating one or more IVD displays corresponding to said wire segments at successive instances in said simulation.

12. The method according to claim 1, said method further comprising the step of:
displaying a streaming combination of a plurality of said electrical characteristics as an instantaneous voltage drop movie.

13. The method according to claim 1, wherein said method further comprises the step of:
allowing said user to vary both (i) a respective block start coordinate and (ii) a respective block stop coordinate for each of said capacitance zones via said graphical user interface.

14. A computer readable medium containing one or more sets of computer executable instructions for performing the steps of claim 1.

15. The method according to claim 1, wherein said power zones comprise (i) a respective power zone capacitance and (ii) a respective voltage controlled current source.

16. The method according to claim 1, wherein said power zones comprise a first number of horizontal busses of said power busses intersecting a second number of vertical busses of said power busses to generate said wire segments.

17. A method for generating an instantaneous voltage drop (IVD) analysis, comprising the steps of:

(A) generating a model of an integrated circuit (IC) core design comprising simulations of (i) a plurality of power meshes configured as a plurality of wire segments, (ii) one or more power zones configured from selected ones of said wire segments, (a) each of said power meshes residing on a different conductive layer of said IC core, (b) each of said power zones having a respective zone capacitance and a respective voltage controlled current source and (c) each of said power zones being bounded by a respective two of a plurality of horizontal power busses and a respective two of a plurality of vertical power busses in a respective one of said power meshes, (iii) a plurality of pad cells connected to said horizontal power busses and said vertical power busses, (iv) a plurality of package and wire bond resistances connected to said pad cells, (v) a plurality of package and wire bond capacitances connected to said pad cells, (vi) a plurality of package and wire bond inductances connected to said pad cells and (vii) one or more simulation capacitance blocks, each of said simulation capacitance blocks comprising (a) a respective capacitance value, (b) a respective physical orientation and (c) a respective physical width;

(B) translating said model of said IC core design to a format compatible with an electronic circuit simulator;

(C) calculating said IVD across one or more of said wire segments via said electronic circuit simulator over a simulation time;

(D) displaying said IVD to a user;

(E) allowing said user to vary (i) said package and wire bond resistances, (ii) said package and wire bond capacitances and (iii) said package and wire bond inductances via a graphical user interface;

(F) allowing said user to vary both (i) respective zone currents and (ii) said respective zone capacitances within said power zones via said graphical user interface; and (G) allowing said user to vary (i) said respective capacitance values of said simulation capacitance blocks, (ii) said respective physical orientation of said simulation capacitance blocks and (iii) said respective physical width of said simulation capacitance blocks via said graphical user interface.

18. An apparatus for analyzing an electrical characteristic of a simulation of wire segments configured as a plurality of power meshes to be used in an integrated circuit (IC) core comprising:
means for (i) specifying a network of power busses that correspond to said power meshes, each of said power meshes residing on a different conductive layer of said IC core, (ii) displaying a calculated electrical characteristic to a user, (iii) allowing said user to vary (a) a plurality of package and wire bond resistances connected to a plurality of pad cells, (b) a plurality of package and wire bond capacitances connected to said pad cells and (c) a plurality of package and wire bond inductances connected to said pad cells and (iv) allowing said user to vary both (a) respective zone currents and (b) respective zone capacitances within one or more power zones; and means for specifying at least one type of analysis to be performed, wherein said analysis comprises (i) generating during said analysis a file corresponding to said IC core in a format compatible with an electronic circuit simulator and (ii) calculating said electrical characteristic of said wire segments via said electronic circuit simulator, wherein (i) said IC core as represented by said file comprises (a) said pad cells connected to respective ones of said power meshes and (b) said power zones, and (ii) each of said power zones is bounded between a respective two horizontal busses of said power busses and a respective two vertical busses of said power busses in a respective one of said power meshes.

19. The method according to claim 1, further comprising the step of:
generating a current input with a voltage controlled current source within said IC core.

20. The method according to claim 17, further comprising the step of:
allowing said user to vary (i) said package and wire bond resistances, (ii) said package and wire bond capacitances and (iii) said package and wire bond inductances via said graphical user interface.

* * * * *